(12) United States Patent
Veis

(10) Patent No.: US 7,705,979 B2
(45) Date of Patent: Apr. 27, 2010

(54) METHOD AND SYSTEM FOR IMMERSION BASED INSPECTION

(75) Inventor: Alexander Veis, Kadima (IL)

(73) Assignee: Applied Materials Israel, Ltd., Rehovot (IL)

( * ) Notice: Subject to any disclaimer, the term of this patent is extended or adjusted under 35 U.S.C. 154(b) by 288 days.

(21) Appl. No.: 11/782,433

(22) Filed: Jul. 24, 2007

(65) Prior Publication Data

US 2009/0027653 A1  Jan. 29, 2009

(51) Int. Cl.
*G01N 21/00* (2006.01)

(52) U.S. Cl. .................................. 356/237.4; 356/237.2

(58) Field of Classification Search .............. 356/237.4, 356/237.2
See application file for complete search history.

(56) References Cited

U.S. PATENT DOCUMENTS

| 7,215,431 | B2 * | 5/2007 | Opsal | .......................... 356/630 |
| 7,436,527 | B2 * | 10/2008 | Opsal | .......................... 356/630 |
| 2004/0263959 | A1 * | 12/2004 | Dixon et al. | ................. 359/385 |
| 2008/0259327 | A1 * | 10/2008 | Brueck et al. | ............ 356/237.5 |

\* cited by examiner

*Primary Examiner*—Roy Punnoose
(74) *Attorney, Agent, or Firm*—Sonnenschein Nath & Rosenthal LLP

(57) ABSTRACT

A method for immersion based inspection, the method includes: (i) receiving an article that comprises a wafer and a transparent element, wherein a first fluid substantially fills a space between an upper surface of the wafer and the transparent element; and (ii) inspecting the wafer by utilizing a lens that contacts a second fluid element that also contacts the transparent element.

22 Claims, 4 Drawing Sheets

Receiving an article that includes a wafer and a transparent element, wherein a first fluid substantially fills a space between an upper surface of the wafer and the transparent element. 210

Inspecting the wafer by utilizing a lens that contacts a second fluid element that also contacts the transparent element. 220

200

METHOD AND SYSTEM FOR IMMERSION BASED INSPECTION

FIELD OF THE INVENTION

The invention relates to methods and systems for immersion based inspection.

BACKGROUND OF THE INVENTION

During the last decades the sizes of wafer features has dramatically decreases. The dimensions of these feature is well below one micron and is expected to shrink during the next coupled of years. Accordingly, the importance of resolution enhancing microscopy solutions has dramatically increased.

The resolution of a microscope is dependent upon various parameters including the numerical aperture (NA) of the microscope and especially the numerical aperture of the objective lens of the microscope. The numerical aperture can be increase by increasing the refractive index of a medium between the wafer and the lens.

A brief description of immersion microscopy is provided in the following documents: "DUV Water Immersion Technology Extends Linearity First Results From the new 65 nm Node CD Metrology System LWM500 WI", F. Hillmann, H. J. Bruck, A. Bosser, www-vistec-semi.com; PCT patent application publication serial number WO 2006/113916 titled "Crytogenic immersion microscope" and U.S. Pat. No. 5,900,354 of Batchelder titled "Method for optical inspection and lithography".

One method of immersion microscopy includes placing a drop of fluid between an objective lens of an inspection system and between an inspected wafer. The inspection process includes scanning the wafer by introducing a relative movement between the wafer and the objective lens.

The upper surface of the wafer includes three dimensional features. When these features are being scanned the drop of fluid can be deformed and, additionally or alternatively, can loose fluid in an unexpected manner. In addition, the scanning speed can be limited in order to limit drop deformations.

It is further noted that this scanning can spread contaminations over the inspected wafer, some contaminations can be initially located at the wafer edges while other contaminations can result from the objective lens or other components of the inspection system.

The mentioned above fluid should comply with various contradicting results: (i) the fluid should not damage the wafer, (ii) the fluid should have a high enough refractive index, (iii) the fluid should be relatively transparent, and (iv) the fluid should be relatively viscose such as to be able to propagate over various features without breaking apart.

There is a need to provide an efficient method and system for Auger spectrometry.

SUMMARY OF THE INVENTION

A method for immersion microscopy, the method includes: receiving an article that comprises a wafer and a transparent element, wherein a first fluid substantially fills a space between an upper surface of the wafer and the transparent element; and inspecting the wafer by utilizing a lens that contacts a second fluid element that also contacts the transparent element.

A system having immersion based inspection capabilities, the system includes: a lens; and a holder adapted to hold an article that comprises a wafer and a transparent element, wherein a first fluid substantially fills a space between an upper surface of the wafer and the transparent element; wherein the system is adapted to inspect the wafer by utilizing the lens while the lens contacts a second fluid element that also contacts the transparent element.

DETAILED DESCRIPTION OF THE DRAWINGS

Conveniently, a first fluid fills the space between an upper surface of a wafer and a first surface of the transparent element while a second fluid element contacts another surface of the transparent element and a lens of an inspection system.

The wafer is isolated from the lens as well as from the second fluid. Conveniently, the first and second fluids can have the same characteristics but this is not necessarily so. According to various embodiments of the invention the first and second fluids differ from each other by at least one of the following characteristics: (i) refractive index, (ii) purity (contamination level), (iii) wafer damage risk level, and (iv) viscosity.

Conveniently, the first fluid can be less viscose than the second fluid as it is not subjected to lens movements.

The first fluid can be selected such as to reduce possible damage caused to the wafer by contacting that fluid. Thus, a wafer damage risk level of the first fluid can be selected to be low, especially in relation to a wafer damage risk level of the second fluid.

Yet according to an embodiment of the invention the viscosity of even the second fluid can be lower in relation to prior art immersion fluids that were expected to remain intact despite being scanned over the three-dimensional features of the surface of the wafer.

Yet according to another embodiment of the invention the first and second fluid are the same. Even when using the same fluid the viscosity of the fluid can be lowered, especially when scanning a smooth surface of the transparent element, transfer of contamination from the edges of the wafer as well as contamination resulting from the inspection process are reduced and even prevented, and the scanning speed can dramatically increase in comparison to various prior art methods.

Figure 1:
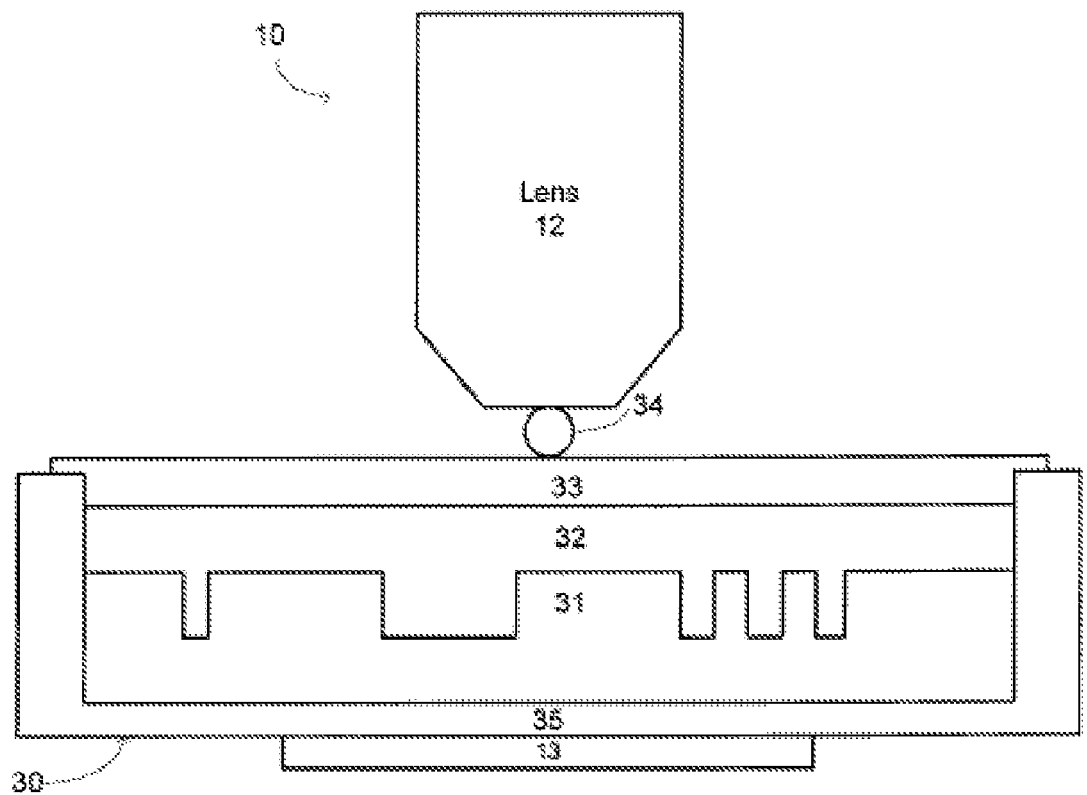
FIGS. 1-2 illustrate cross sections of an article, a lens and a holder of systems according to an embodiment of the invention.
Figure 2:
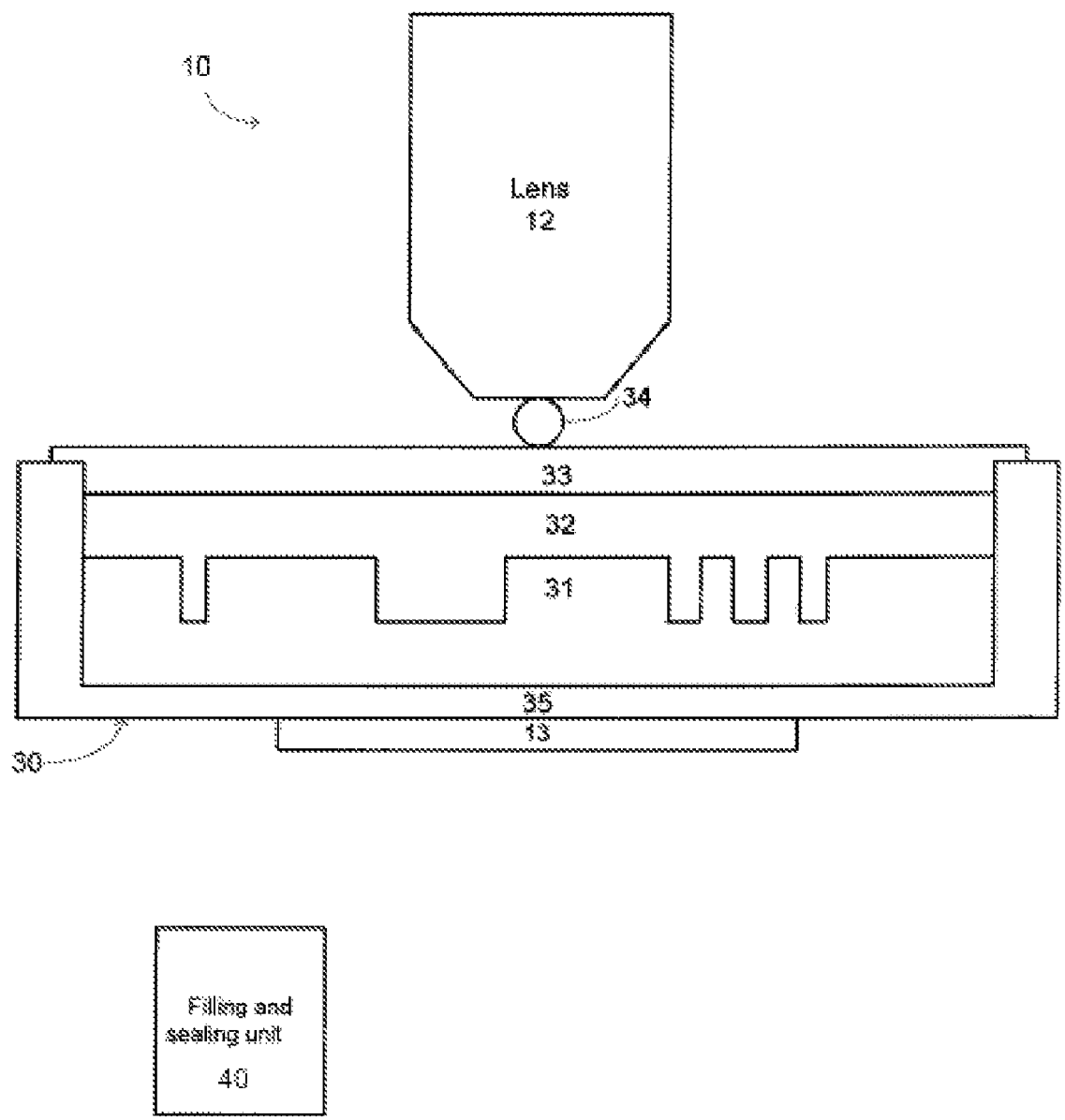

FIG. 1 illustrates a cross section of article 30, lens 12 and holder 13 of a system 10 according to an embodiment of the invention. It is noted that FIGS. 1 and 2 are out of scale.

It is noted that system 10 can include additional lenses, mechanics, image processors and/or eyepieces as well as additional or alternative components that are not shown for simplicity of explanation. Typically, system 10 can include a radiation source such as a laser, a lamp, an electron beam source and the like. It is further noted that system 10 can perform inspection and/or metrology applications.

Lens 12 can be an objective lens and can be used to direct radiation towards wafer 31 and, additionally or alternatively, from wafer 31. System 10 can use bright field techniques and, additionally or alternatively, use dark field illumination techniques. System 10 can also continuously scan wafer 31 or use pulsed illumination and/or detection methods.

Conveniently, wafer 31 is scanned by lens 12 while being held stable. This stability as well as an adequate filling of the space between wafer 31 and transparent element 33 prevents first fluid turbulence and can enable higher scanning speeds.

Conveniently, transparent element 33 is a part of a housing 35 or is connected to housing 35 by using optical gluing.

Conveniently, an image of wafer 31 is acquired by detecting light (or other radiation) that is reflected or scattered from the upper surface of wafer 31, passes through first fluid 32, transparent element 33 and the element of second fluid 34 before reaching lens 12.

FIG. 2 illustrates filling and sealing unit 40 as well as provides a cross section of article 30, lens 12 and holder 13 of system 11 according to an embodiment of the invention. It is noted that FIGS. 1 and 2 are out of scale.

System 11 of FIG. 2 differs from system 10 of FIG. 1 by including filling and sealing unit 90. Filling and sealing unit 90 is adapted to: (i) receive the wafer and the transparent element, (ii) provide the first fluid to a space above the upper surface of the wafer, and (iii) seal the space by the transparent element. Filling and sealing unit 90 can apply prior art filling and sealing techniques can be employed.

Figure 3:
FIGS. 3-4 illustrate methods for inspecting a wafer according to an embodiment of the invention.

FIG. 3 illustrates method 200 for immersion based inspection, according to an embodiment of the invention.

Method 200 starts by stage 210 of receiving an article that includes a wafer and a transparent element, wherein a first fluid substantially fills a space between an upper surface of the wafer and the transparent element.

Stage 210 is followed by stage 220 of inspecting the wafer by utilizing a lens that contacts a second fluid element that also contacts the transparent element.

Conveniently, stage 220 includes at least one of the following: (i) moving the lens and the second fluid element over the transparent element while substantially preventing first fluid turbulences, (ii) moving the second fluid element over a smooth surface of the transparent element.

Figure 4:
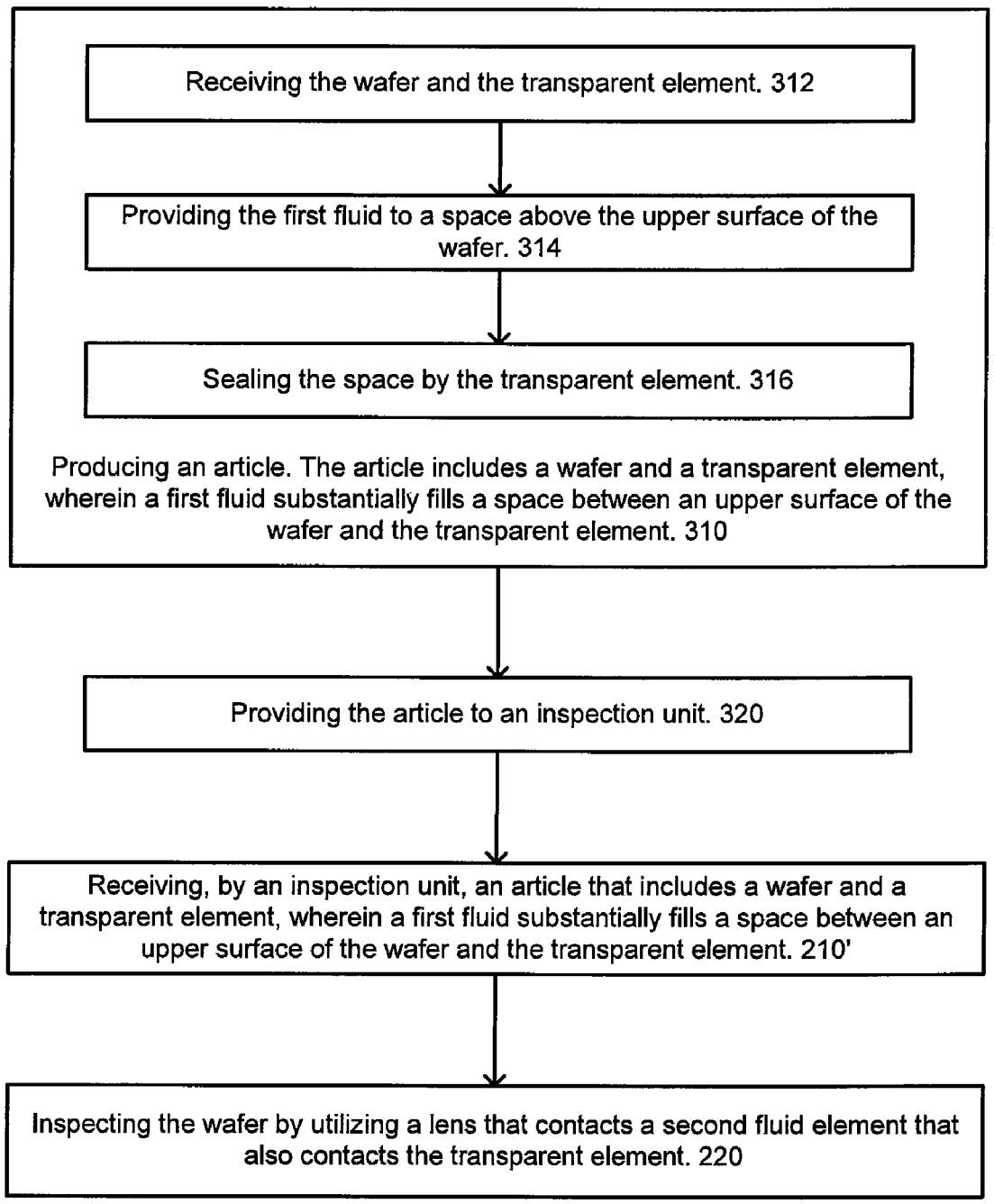

FIG. 4 illustrates method 300 for immersion based inspection according to an embodiment of the invention.

Method 300 starts by stage 310 of producing an article. The article includes a wafer and a transparent element, wherein a first fluid substantially fills a space between an upper surface of the wafer and the transparent element.

Conveniently, stage 310 includes stage 312 of receiving the wafer and the transparent element, stage 314 of providing the first fluid to a space above the upper surface of the wafer, and stage 314 sealing the space by the transparent element. Various prior art fluid filling and sealing techniques can be employed.

Conveniently, stage 310 includes allowing the first fluid to fill the space such that when the space is sealed the space is without substantial air bubbles. This can be achieved by allowing the fluid to settle as well as fill the space in several iterations and even enable some fluid to spill, in order to fill the space that should be sealed by the transparent element.

Stage 310 is followed by stage 320 of providing the article to an inspection unit.

Stage 320 is followed by stage 210' of receiving, by the inspection unit, an article that includes a wafer and a transparent element, wherein a first fluid substantially fills a space between an upper surface of the wafer and the transparent element.

Stage 210' is followed by stage 220.

The present invention can be practiced by employing conventional tools, methodology and components. Accordingly, the details of such tools, component and methodology are not set forth herein in detail. In the previous descriptions, numerous specific details are set forth, in order to provide a thorough understanding of the present invention. However, it should be recognized that the present invention might be practiced without resorting to the details specifically set forth.

Only exemplary embodiments of the present invention and but a few examples of its versatility are shown and described in the present disclosure. It is to be understood that the present invention is capable of use in various other combinations and environments and is capable of changes or modifications within the scope of the inventive concept as expressed herein.

I claim:

1. A method for immersion based inspection, the method comprising:
   receiving an article comprising a wafer, a housing, and a transparent element, wherein a first fluid substantially fills a space bounded by an upper surface of the wafer, an inner surface of the housing and the transparent element; and
   inspecting the wafer by utilizing a lens that contacts a second fluid element that also contacts the transparent element.

2. The method according to claim 1 wherein the inspecting comprises moving the lens and the second fluid element over the transparent element while substantially preventing first fluid turbulences.

3. The method according to claim 1 wherein the inspecting comprises moving the second fluid element over a smooth surface of the transparent element.

4. The method according to claim 1 further comprising receiving the wafer, providing the first fluid to a space above the upper surface of the wafer and sealing the space by the transparent element.

5. The method according to claim 4 wherein sealing comprises allowing the first fluid to fill the space such that when the space is sealed the space is without substantial air bubbles.

6. The method according to claim 1 wherein a refractive index of the second fluid equals a refractive index of the second fluid.

7. The method according to claim 1 wherein a refractive index of the second fluid differs from a refractive index of the first fluid.

8. The method according to claim 1 wherein a contamination level of the second fluid element differs than a contamination level of the first liquid.

9. The method according to claim 1 wherein the first fluid is characterized by a wafer damage risk level that is lower than a wafer damage risk level of the second fluid.

10. The method according to claim 1 further comprising temporarily disconnecting the lens from the second fluid element.

11. The method according to claim 1 wherein a viscosity of the second fluid element differs from a viscosity of the first liquid.

12. A system having immersion based inspection capabilities, the system comprising:
    a lens; and
    an article comprising a wafer, a housing, and a transparent element, wherein a first fluid substantially fills a space bounded by an upper surface of the wafer, an inner surface of the housing, and the transparent element;
    wherein the system is adapted to inspect the wafer by utilizing the lens while the lens contacts a second fluid element that also contacts the transparent element.

13. The system according to claim 12 wherein the system is adapted to move the lens and the second fluid element over the transparent element while substantially preventing first fluid turbulences.

14. The system according to claim 12 wherein the system is adapted to translate the lens within an imaginary flat plane that is substantially parallel to a smooth surface of the transparent element.

15. The system according to claim 12 comprising a filling and sealing unit adapted to receive the wafer, provide the first fluid to a space above the upper surface of the wafer and seal the space by the transparent element.

16. The system according to claim 15 wherein the filling and sealing unit is adapted to allowing the first fluid to fill the space such that when the space is sealed the space is without substantial air bubbles.

17. The system according to claim 12 wherein a refractive index of the second fluid equals a refractive index of the second fluid.

18. The system according to claim 12 wherein a refractive index of the second fluid differs from a refractive index of the first fluid.

19. The system according to claim 12 wherein a contamination level of the second fluid element differs from a contamination level of the first liquid.

20. The system according to claim 12 wherein the first fluid is characterized by a wafer damage risk level that is lower than a wafer damage risk level of the second fluid.

21. The system according to claim 12 further adapted to temporarily disconnect the lens from the second fluid element.

22. The system according to claim 12 wherein a viscosity of the second fluid element differs from a viscosity of the first liquid.

* * * * *